(12) United States Patent
Yun et al.

(10) Patent No.: US 8,277,675 B2
(45) Date of Patent: Oct. 2, 2012

(54) METHOD OF DAMAGED LOW-K DIELECTRIC FILM LAYER REMOVAL

(75) Inventors: Seokmin Yun, Pleasanton, CA (US);
Seong Hwan Cho, Fremont, CA (US);
Shrikant Lohokare, Fremont, CA (US);
Mark Wilcoxson, Oakland, CA (US);
John M. De Larios, Palo Alto, CA (US);
Stephan Hoffmann, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 799 days.

(21) Appl. No.: 11/644,779

(22) Filed: Dec. 21, 2006

(65) Prior Publication Data

US 2009/0173718 A1 Jul. 9, 2009

Related U.S. Application Data

(60) Continuation-in-part of application No. 11/542,700, filed on Oct. 3, 2006, now Pat. No. 7,383,844, which is a division of application No. 10/330,843, filed on Dec. 24, 2002, now Pat. No. 7,198,055, which is a continuation-in-part of application No. 10/261,839, filed on Sep. 30, 2002, now Pat. No. 7,234,477.

(51) Int. Cl.
*B44C 1/22* (2006.01)
*B08B 7/04* (2006.01)

(52) U.S. Cl. ............ 216/95; 134/2; 134/6; 134/15; 216/88; 156/345.17

(58) Field of Classification Search ............ 216/95; 156/345.17; 134/2, 6, 15
See application file for complete search history.

(56) References Cited

U.S. PATENT DOCUMENTS

| 6,488,040 | B1 | 12/2002 | de Larios et al. |
| 6,951,823 | B2 * | 10/2005 | Waldfried et al. ............ 438/710 |
| 2002/0189643 | A1 * | 12/2002 | Chen et al. ..................... 134/6 |
| 2004/0069329 | A1 * | 4/2004 | de Larios et al. ............ 134/95.2 |
| 2005/0014667 | A1 * | 1/2005 | Aoyama et al. ............... 510/175 |
| 2005/0077597 | A1 * | 4/2005 | Toma et al. ................... 257/629 |
| 2006/0172531 | A1 | 8/2006 | Lin et al. |

FOREIGN PATENT DOCUMENTS

KR 10-2005-0009654 A 1/2005
KR 10-2005-0108152 A 11/2005

OTHER PUBLICATIONS

International Search Report -PCT/US2007/024404 (3 pages) Dated May 9, 2008.

* cited by examiner

*Primary Examiner* — Shamim Ahmed
(74) *Attorney, Agent, or Firm* — Martine Penilla Group, LLP

(57) ABSTRACT

An apparatus, system and method for removing a damaged material from a low-k dielectric film layer include identifying a control chemistry, the control chemistry configured to selectively remove the damaged material from the low-k dielectric film layer, the damaged material being in a region where a feature was formed through the low-k dielectric film layer; establishing a plurality of process parameters characterizing aspects of the damaged material to be removed and applying the control chemistry to the low-k dielectric film layer, the application of the control chemistry being defined based on the established process parameters of the damaged material, such that the damaged material is substantially removed from the areas around the feature and the areas around the feature are substantially defined by low-k characteristics of the low-k dielectric film layer.

17 Claims, 9 Drawing Sheets

METHOD OF DAMAGED LOW-K DIELECTRIC FILM LAYER REMOVAL

CLAIM OF PRIORITY

This application claims priority under 35 U.S.C. 120 as a continuation-in-part application of U.S. patent application Ser. No. 11/542,700, now issued as U.S. Pat. No. 7,383,844, filed on Oct. 3, 2006, and entitled "Meniscus, Vacuum, IPA, Vapor, Drying Manifold," which claimed priority under 35 U.S.C. 120 as a divisional application of U.S. patent application Ser. No. 10/330,843, now issued as U.S. Pat. No. 7,198,055, filed on Dec. 24, 2002, and entitled, "Meniscus, Vacuum, IPA Vapor, Drying Manifold," and which claimed priority under 35 U.S.C. 120 as a continuation-in-part application of U.S. patent application Ser. No. 10/261,839, now issued as U.S. Pat. No. 7,234,477, filed on Sep. 30, 2002, and entitled "Method and Apparatus for Drying Semiconductor Wafer Surfaces Using a Plurality of Inlets and Outlets Held in Close Proximity to the Wafer Surfaces".

FIELD OF THE INVENTION

The present invention relates generally to semiconductor substrate processing, and more particularly, to a method and apparatus for removing a damaged low-k dielectric film layer from the semiconductor substrate during fabrication operations.

DESCRIPTION OF THE RELATED ART

Integrated Circuit (IC) features have been shrinking in size over the past few decades resulting in tremendous performance improvements in IC chips. This has resulted in increased speed and density of the chip device. The speed of an electrical signal in an IC relies on the switching time of an individual transistor (transistor gate delay) and the signal propagation time between transistors (Resistance-Capacitance delay or RC delay). As transistor features continue to diminish in size and density continues to increase, the RC delay that was once known to have least impact has now started playing a prominent role in chip performance. RC delay can be reduced by using high conductivity metals in interconnect wiring to lower resistance and/or by using low dielectric constant materials in the inter level dielectric layers to reduce capacitance. Aside from reducing RC delay, low-k dielectric materials enable consumption of less power and reduce capacitive coupling, also known as crosstalk, between interconnect features.

There are several low-k dielectric materials available with a dielectric constant range between 2.5 and 4.0. However, as feature sizes continue to diminish, there is a need for ultra-low-k dielectric materials. The ultra-low-k dielectric material can be obtained by doping a low-k dielectric material with either fluorine or carbon based compounds and/or by the introduction of pores into the low-k dielectric material that separate the interconnect features. Introduction of pores, however, create new challenges as they affect material properties such as mechanical strength, thermal stability and adhesion to different substrate layers among others. These material properties determine if the material can withstand the rigors of further substrate processing such as chemical mechanical polishing (CMP), wire-bonding, packaging, among others.

The ultra-low-k dielectric material separating the features may get physically and chemically damaged by various fabrication operations used in forming features on the substrate, such as CVD, etching, polishing, etc., as the material properties of the ultra-low-k dielectrics are sometimes compromised. The damage may be due to depletion of carbon content from a portion of the ultra-low-k dielectric layer immediately adjacent to the features formed, resulting in an increase of the dielectric constant in the dielectric layer. This increase in the dielectric constant contributes to RC delay.

In view of the foregoing, there is a need for integration schemes that enable processing, while effective removal of any damaged low-k dielectric film layer can be accomplished.

SUMMARY

The present invention fills the need by providing an improved method and apparatus for removing a damaged material from a low-k dielectric film layer of a substrate. It should be appreciated that the present invention can be implemented in numerous ways, including as an apparatus and a method. Several inventive embodiments of the present invention are described below.

In one embodiment, a method for removing a damaged material from a low-k dielectric film layer of a substrate is disclosed. The method includes identifying a control chemistry, the control chemistry configured to selectively remove the damaged material from the low-k dielectric film layer, the damaged material being in a region where a feature was formed through the low-k dielectric film layer. The method further includes establishing a plurality of process parameters characterizing aspects of the damaged material to be removed and applying the control chemistry to the low-k dielectric film layer, the application of the control chemistry being defined based on the established process parameters of the damaged material, such that the damaged material is substantially removed from the areas around the feature and the areas around the feature are substantially defined by low-k characteristics of the low-k dielectric film layer.

In another embodiment, a system for removing a damaged material from a low-k dielectric film layer of a substrate is disclosed. The system includes a substrate supporting device to receive and support the substrate and a control delivery mechanism for applying a control chemistry to the low-k dielectric film layer, the application of the control chemistry being defined based on a plurality of process parameters of the damaged material such that the damaged material is substantially removed from the areas around the feature and the areas around the feature are substantially defined by low-k characteristics of the low-k dielectric film layer. The control chemistry is identified for selective removal of the damaged material formed in a region where a feature was formed through the low-k dielectric film layer and the plurality of process parameters characterizes aspects of the damaged material.

BRIEF DESCRIPTION OF THE DRAWINGS

The invention may best be understood by reference to the following description taken in conjunction with the accompanying drawings. These drawings should not be taken to limit the invention to the preferred embodiments, but are for explanation and understanding only.

DETAILED DESCRIPTION

Several embodiments for an improved and more effective removal of damaged material from a low-k dielectric film layer of a substrate will now be described. It will be obvious, however, to one skilled in the art, that the present invention may be practiced without some or all of these specific details. In other instances, well known process operations have not been described in detail in order not to unnecessarily obscure the present invention.

The low dielectric constant of a low-k dielectric layer may be restored by removing damaged material from the low-k dielectric layer. With the current trend of technological advancement of reduced feature size and increased density of features, the removal of the damaged low-k dielectric material poses a significant challenge. Some methods of removing the damaged low-k dielectric material will result in damage to the feature itself or damage to the underlying copper interconnects or more damage to the low-k dielectric film, thereby rendering the features inoperable.

Effective removal of damaged material from a low-k dielectric film layer of a substrate is very important so as to preserve the quality of the features formed on the substrate and the resulting semiconductor products, e.g., microchips. In an embodiment of the invention, the damaged material found in a region where a feature was formed through the low-k dielectric film layer, is removed by applying a control chemistry. The application is defined by a plurality of process parameters that characterize aspects of the damaged material to be removed, such that the damaged material is substantially removed from the areas around the feature. The areas around the feature after the damaged material is removed are defined by the low-k dielectric characteristics of the low-k dielectric film layer. The controlled exposure of the control chemistry assists in effective removal of the damaged material without detrimentally affecting the surrounding features and achieves desired surface passivation in preparation for further deposition and fabrication operations.

Figure 1A:
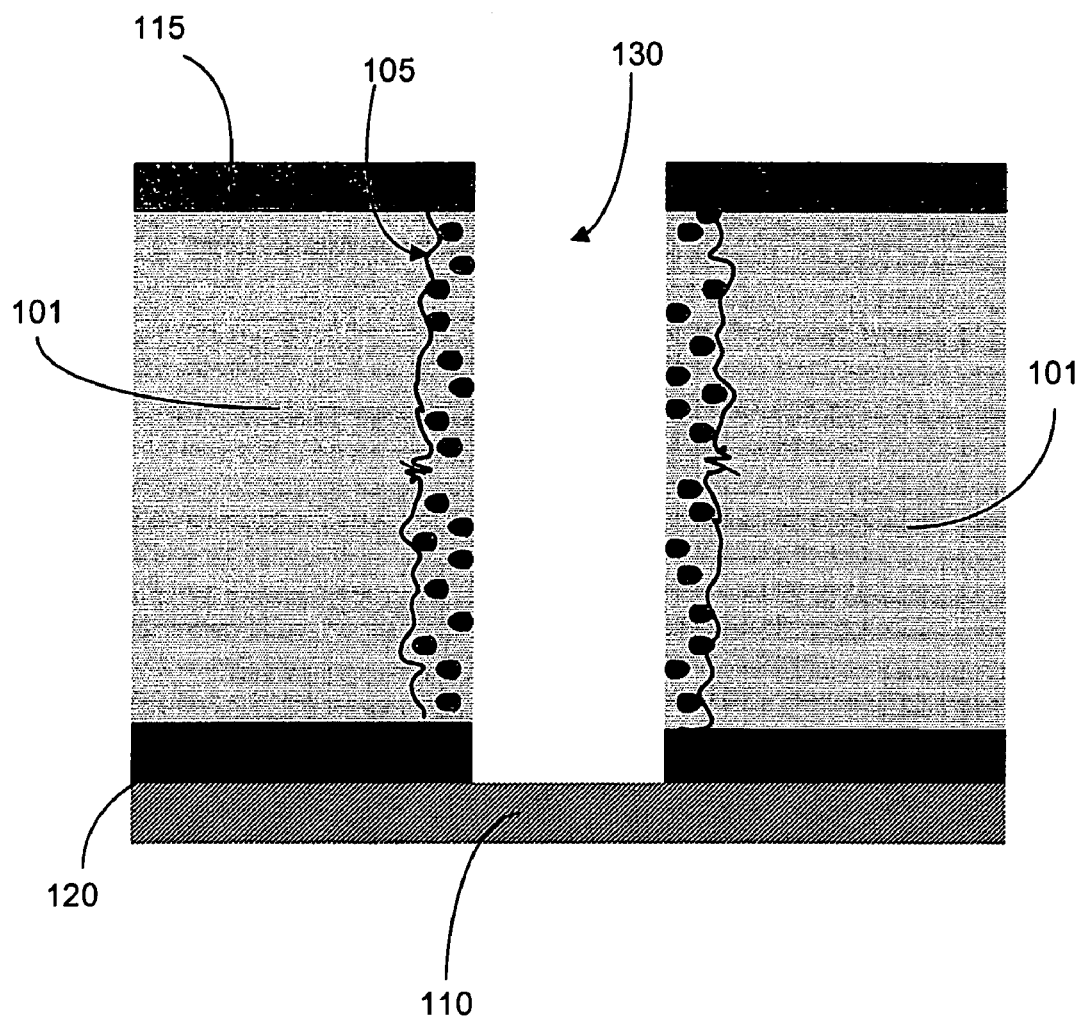
FIG. 1A is a simplified schematic diagram illustrating a damaged material in an area around a feature formed in a low-k dielectric film layer.

FIG. 1A illustrates a simplified schematic diagram of a damaged material in an area around a feature 130 formed through a low-k dielectric film layer. As shown, a low-k dielectric film layer 101 is formed on a substrate 100. The low-k dielectric film layer 101 is formed using any one of spin coating, dip coating, or by a chemical vapor deposition technique. A low-k dielectric material can be one of SiCOH, Porous SiCOH, Polyarylene ether, Porous polyarylene ether, porous Silicon Dioxide, etc., and can be doped with carbon to further lower the dielectric constant of the low-k dielectric film layer 101. The low-k dielectric film layer 101 maybe formed directly over the substrate surface, over previously fabricated layers such as etch stop layer 120 or in-between a plurality of fabricated layers. The low-k dielectric film layer 101 provides insulation to one or more features 130 etched through the low-k dielectric film layer 101 or to the underlying features such as copper interconnects 110 that connect down to transistors formed on the substrate 100. Due to compromised material properties of the low-k dielectric film layer 101, portions of the low-k dielectric film layer 101 may get damaged during one or more fabrication operations used in creating features 130 through the low-k dielectric film layer 101. This damage can be caused by the chemicals used in the fabrication operations that deplete carbon from the low-k dielectric film layer 101 in areas around the features 130 formed through the low-k dielectric film layer 101. The depletion of carbon from the damaged areas result in higher dielectric constant at the damaged area than the rest of the low-k dielectric film layer 101, contributing to line delay. Line delay, also known as RC delay, is defined as a delay in signal propagation between transistors that could be caused by resistance of the materials used in the interconnects and/or the capacitance of the interlevel dielectric layer.

Figure 1B:
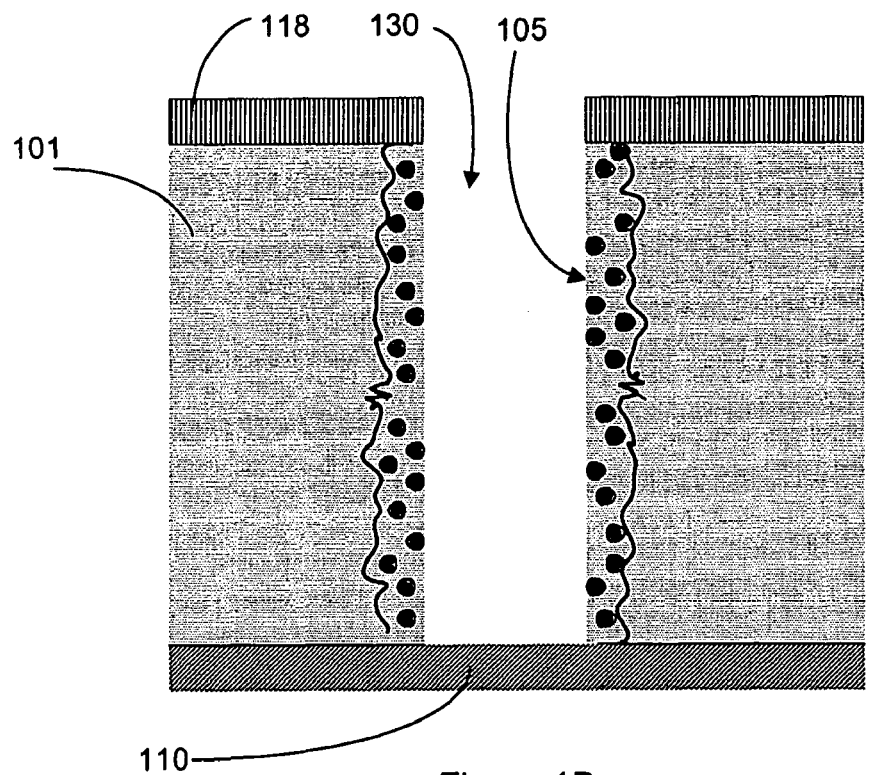
FIGS. 1B and 1C illustrate simplified schematic diagrams of a damaged material in a region around a feature formed during a photoresist operation and the resulting feature after control chemistry has been applied, in one embodiment of the invention.
Figure 1C:
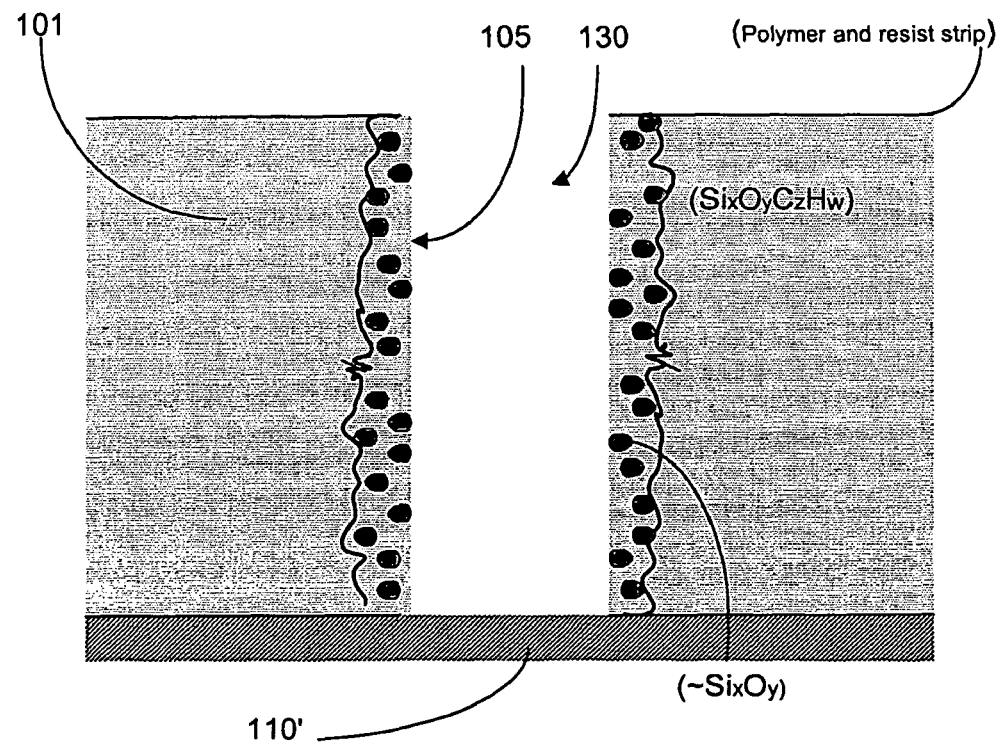

FIGS. 1B and 1C illustrate a damaged area formed by damaged material 105 near a feature 130. FIG. 1B illustrates the damaged material 105 formed at the low-k dielectric film layer 101 near a feature 130 formed over a copper interconnect 110. A photoresist layer 118 is shown on top of the low-k dielectric film layer 101.

FIG. 1C illustrates a damaged material 105 at the low-k dielectric film layer 101 around the wall surfaces of a feature 130 after a photoresist strip operation, where the photoresist layer 118 is selectively stripped. The feature 130 is formed through the low-k dielectric film layer 101 over the copper interconnect 110. A chemical used in forming the feature 130 through both the photoresist layer 118 and the low-k dielectric film layer 101 may cause the formation of the damaged material 105 at the low-k dielectric film layer 101 adjacent to the feature 130. In this embodiment, the chemical composition of the low-k dielectric film layer 101 is of the form $Si_xO_yC_zH_w$, while the composition of the damaged material 105 resembles that of $Si_xO_y$ due to carbon depletion.

Figure 2A:
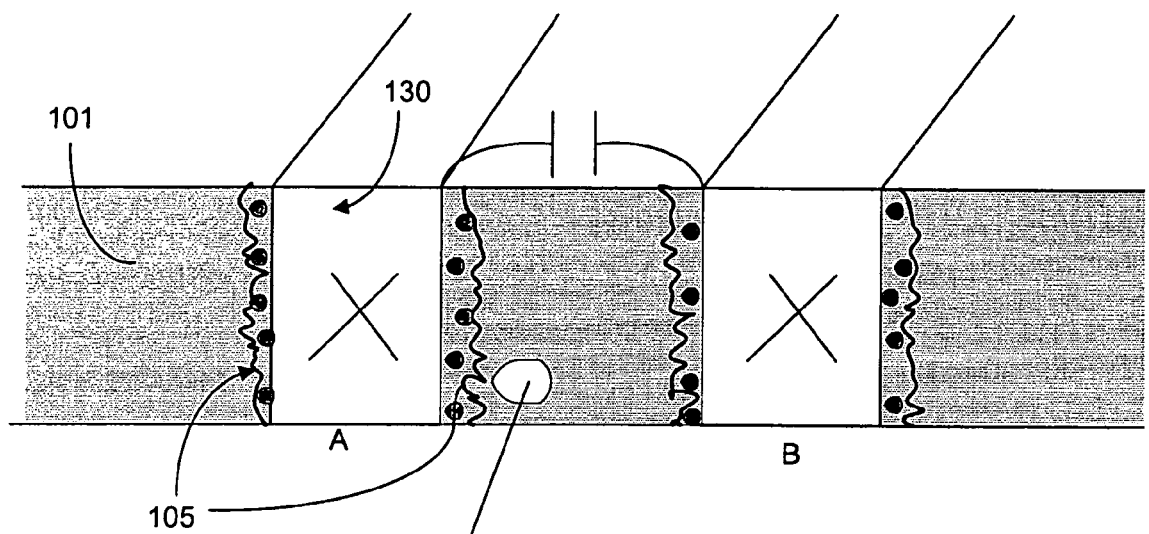
FIG. 2A is a simplified schematic diagram illustrating a plurality of features formed through a low-k dielectric film layer.
Figure 2B:
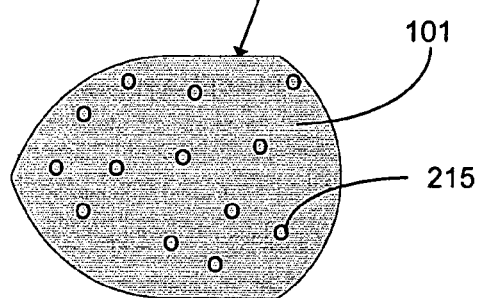
FIG. 2B illustrates the composition of the low-k dielectric film layer, in one embodiment of the present invention.

FIG. 2A illustrates a simplified schematic diagram of a plurality of features 130 formed at the substrate separated by a low-k dielectric film layer 101. The low-k dielectric film layer 101 is formed using either the spin-on technique or the CVD technique. The low-k dielectric material, used in forming the low-k dielectric film layer 101, is doped with carbon and a plurality of sub-micron pores are introduced to further lower the dielectric constant. Pores can be introduced using well-known techniques and is, therefore, not elaborated in this application. A plurality of features 130 are formed on the substrate using various fabrication operations and these features 130 are isolated using the low-k dielectric film layer 101. Isolating these features using the low-k dielectric film layer 101 helps in reducing coupling capacitance between features 130 at points A and B of FIG. 2A thereby reducing line delay. It is essential in retaining the low-k dielectric film layer characteristics so that the functionality of the low-k dielectric film layer 101 and the features 130 formed through the dielectric film layer 101 are preserved. FIG. 2B shows a small area of the low-k dielectric film layer 101 doped with carbon and sub-micron pores 215 interspersed in the low-k dielectric film layer 101.

Figure 3A:
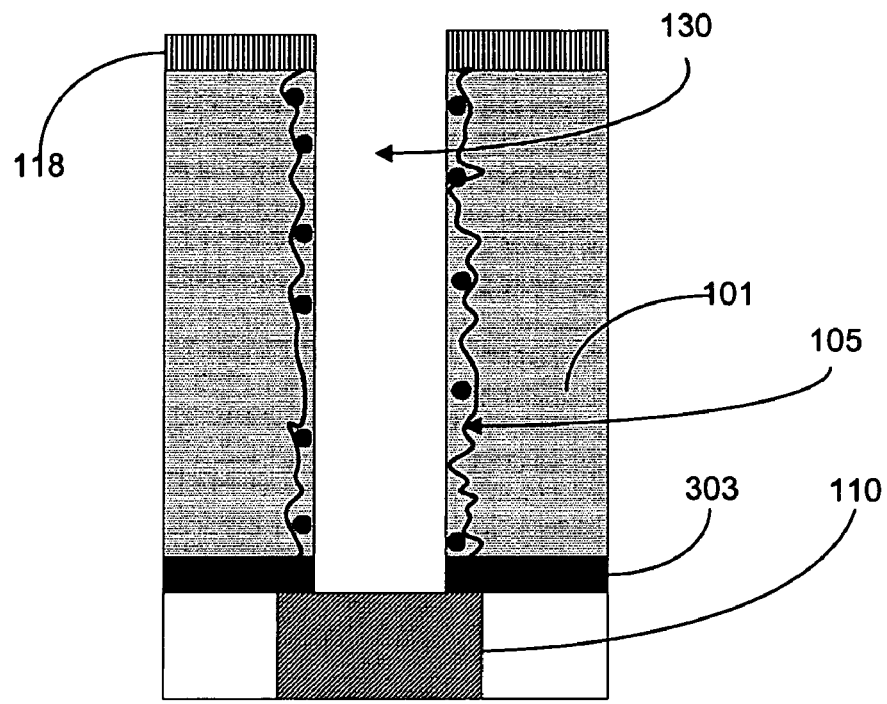
FIGS. 3A and 3B illustrate a cross-sectional view of a damaged material layer before control chemistry application and a damage-free low-k dielectric region after the application of the control chemistry, in one embodiment of the invention.
Figure 3B:
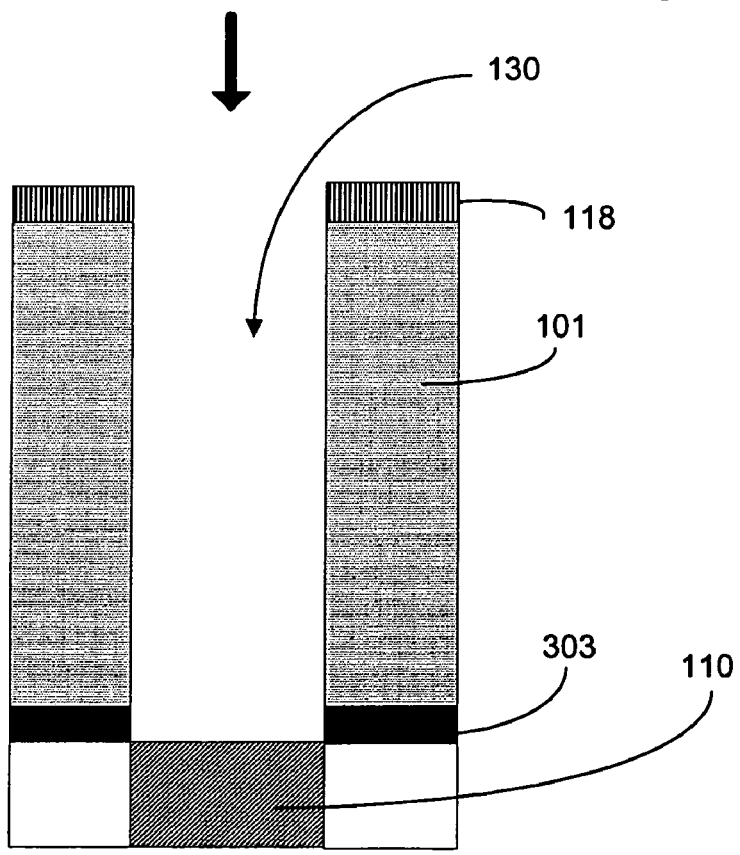

FIGS. 3A and 3B illustrate a cross-sectional view of a damaged material and the low-k dielectric film layer 101 formed near a feature 130 before a control chemistry is applied and a damaged material free low-k dielectric film layer 101 after a control chemistry is applied, in one embodiment of the invention. FIG. 3A illustrates a portion of the substrate where a feature 130 is formed over a copper interconnect 110. A plurality of features 130 and the underlying feature are separated by a layer of a low-k dielectric film layer 101. The low-k dielectric film layer 101 may be formed directly over a feature on the substrate or in between layers, such as an etch stop layer 120 and a hard mask layer 322, formed using one or more fabrication operations such as etching, chemical mechanical polishing, cleaning, deposition, etc. The walls of the low-k dielectric film layer 101 surrounding the features 130 are damaged due to carbon depletion during the one or more fabrication operations. The damaged material 105 has a higher dielectric constant than the rest of the low-k dielectric film layer 101. Based on an integration scheme followed during the fabrication process in one embodiment of the invention, the damaged material 105 can be removed in conjunction with portions of the other layers, such as the hard mask layer 322 and the etch stop layer 120, for example, formed over and below the damaged material 105 through which the feature is formed, as shown in FIG. 3B. In another embodiment, a different integration scheme is followed and only the damaged material 105 is removed.

Figure 4:
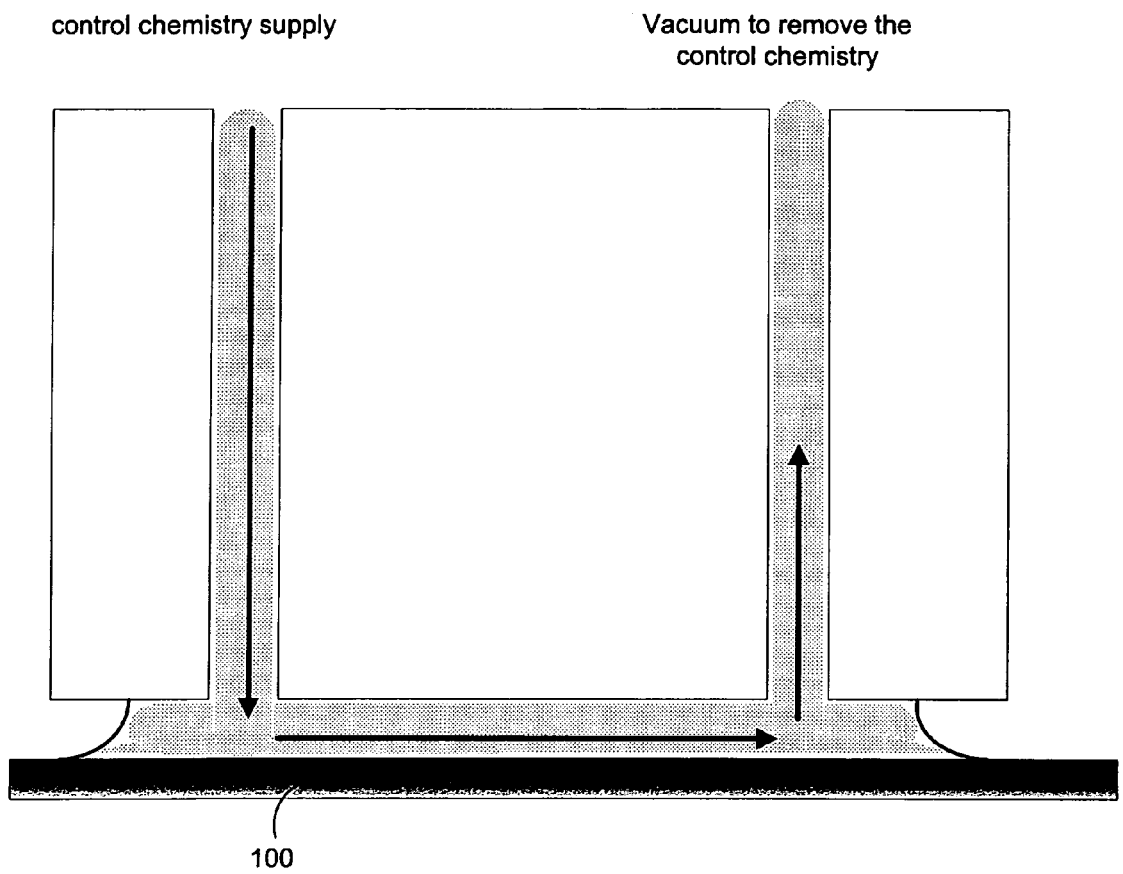
FIG. 4 is a cross-sectional view illustrating application of a control chemistry to a substrate using a single proximity head, in one embodiment of the invention.

FIG. 4 illustrates a cross-sectional view of a system used in applying a control chemistry to a low-k dielectric film layer 101 so that a damaged material 105, formed in a region where a feature 130 was formed through the low-k dielectric film layer 101, is substantially removed. The system includes a substrate supporting device and a proximity head to control the delivery of the control chemistry to the low-k dielectric film layer 101 to substantially remove the damaged material 105 in an area around a feature 130 formed through the low-k dielectric film layer 101. The substrate supporting device is any type of device that is capable of receiving and supporting the substrate on a selected plane.

The application of the control chemistry is defined by a plurality of process parameters of the damaged material 105 formed at the low-k dielectric film layer 101 adjacent to the feature 130 formed. The process parameters are collected by analyzing the damaged material 105, the analysis characterizing various aspects of the damaged material 105. The process parameters may further include characteristic aspects of one or more film layers (such as 120, 118 and 122) formed over and/or under the damaged material 105 that may need to be removed to retain the feature 130 profile. The process parameters may include type of film layer, composition of the film layer, thickness of the damaged material 105 and temperature of the film layer in the area where the feature 130 is formed. These process parameters may change from one substrate to the next. The control delivery mechanism may additionally include controls to control one or more characteristics of the control chemistry. By controlling the application of the control chemistry based on the process parameters and the control chemistry characteristics, appropriate control chemistry is exposed at the region of the damaged material 105 of the low-k dielectric film layer 101 resulting in substantial removal of the damaged material 105 from the low-k dielectric film layer 101 while retaining the low-k dielectric constant of the remaining low-k dielectric film layer 101.

In one embodiment, a single proximity head is used to remove damaged material 105 formed on a substrate 100, as illustrate in FIG. 4. The proximity head is used in applying the control chemistry as a liquid meniscus to the damaged material 105 and the application of the control chemistry is controlled based on a plurality of process parameters of the damaged material 105 and the corresponding film layers 118, 120, 322 formed over and under the damaged material 105 to be removed. The term, "meniscus," as used herein, refers to a volume of liquid bounded and contained in part by surface tension of the liquid. The meniscus is also controllable and can be moved over a surface in the contained shape. In specific embodiments, the meniscus is maintained by the delivery of fluids to a surface while also removing the fluids so that the meniscus remains controllable. Furthermore, the meniscus shape can be controlled by precision fluid delivery and removal systems that may further include a computing system.

Figure 8:
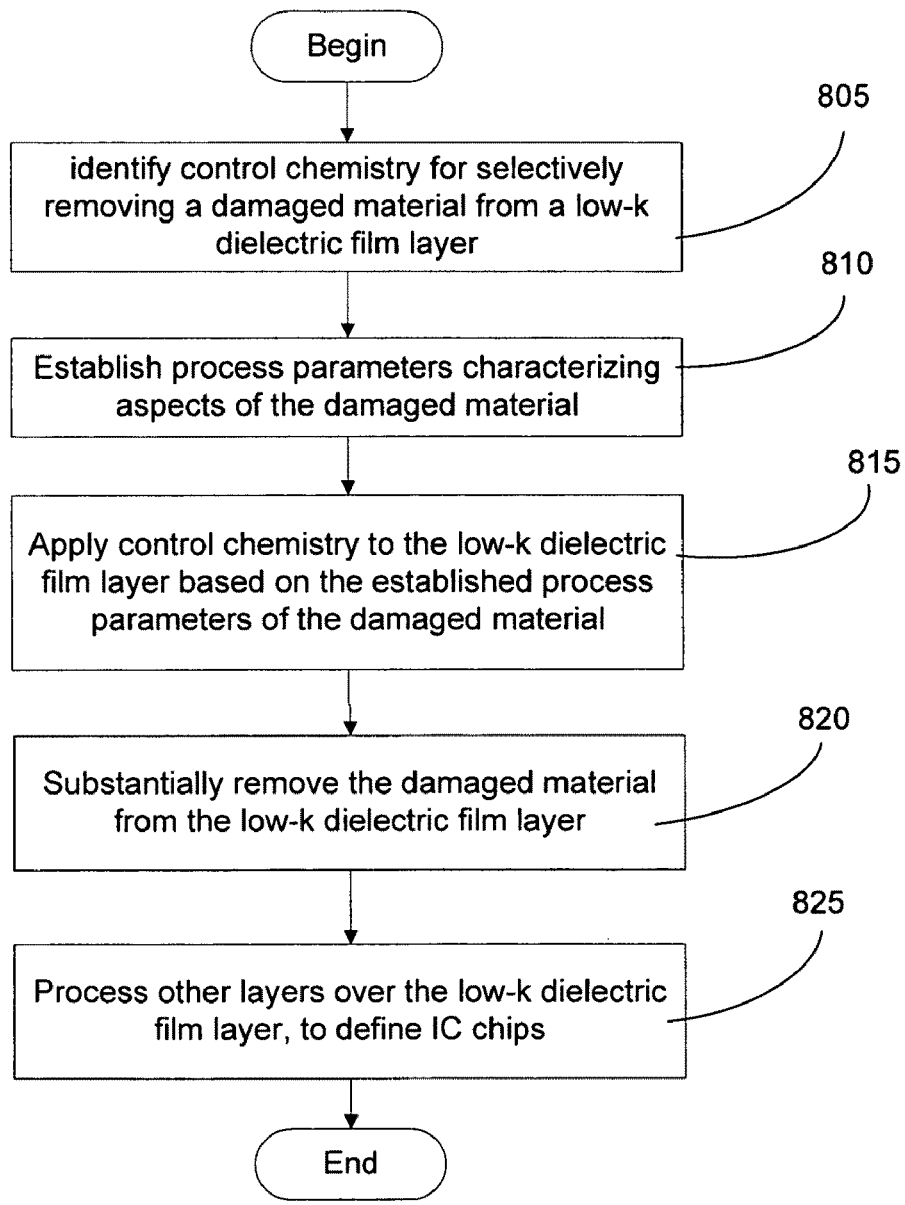
FIG. 8 illustrates the operations involved in removing damaged material from a low-k dielectric film layer, in one embodiment of the invention.

The application of the control chemistry may be a separate process operation or can be combined with other operations such as cleaning or pre-deposition preparation operation. In one embodiment of the invention, the control chemistry is alternated with a cleaning chemistry and the two are applied alternatively during a cleaning operation using the single proximity head. The process of removal of the damaged material 105 from the area adjacent to one or more features using a control chemistry applied through a single proximity head, is illustrated in FIG. 8. The damaged material formed near the feature 130 may be in the sub-micron range. In one embodiment, the width of the damaged material 105 is about 50 A° unit.

Figure 5:
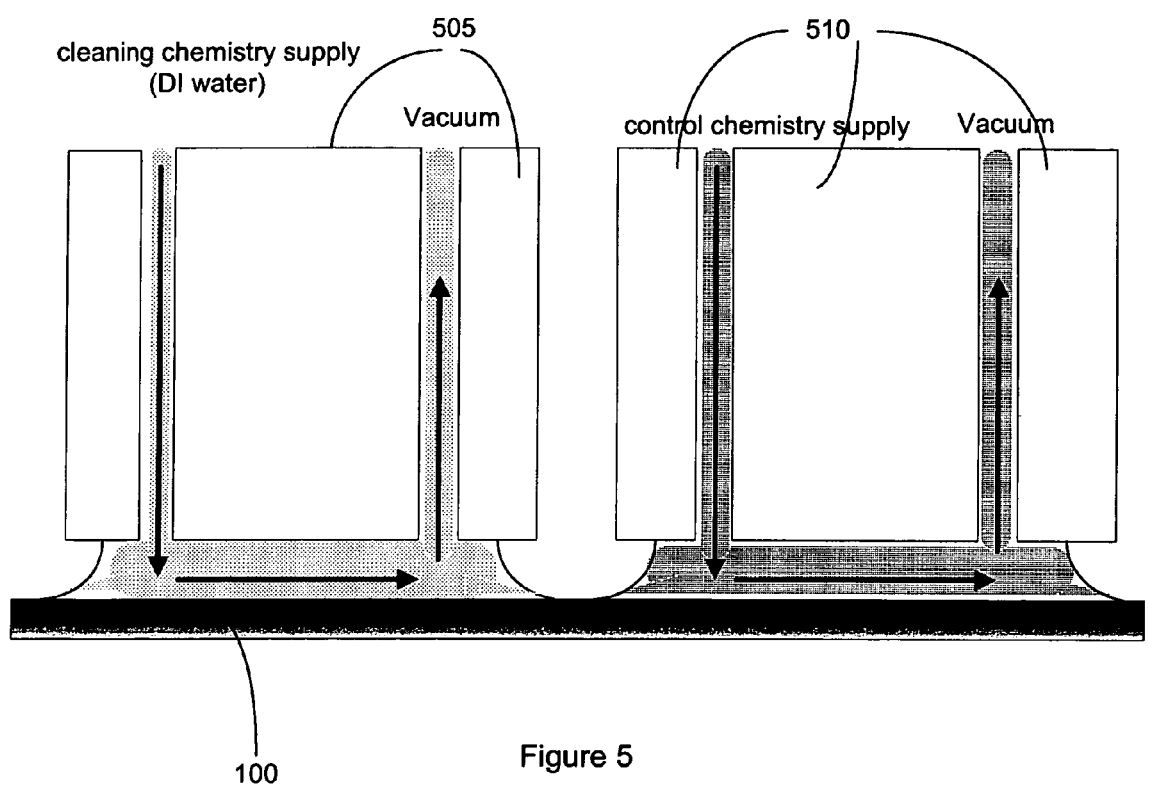
FIG. 5 is a cross-section view illustrating application of a control chemistry to a substrate using dual proximity heads, in one embodiment of the invention.

In another embodiment of the invention, the system used to apply control chemistry uses two proximity heads 505 and 510, as illustrated in FIG. 5. In this embodiment, the removal of the damaged material 105 is integrated with a cleaning operation wherein a cleaning chemistry is applied to the surface of the substrate 100 through a first proximity head 505 while the control chemistry is applied to the damaged material 105 using the second proximity head 510. The simultaneous application of the control chemistry is not restricted to the cleaning operation. The control chemistry may be applied to the damaged material 105 simultaneously during other fabrication operation such as pre-deposition preparation, for example.

For additional information with respect to the proximity head, reference can be made to an exemplary proximity head, as described in the U.S. Pat. No. 6,616,772, issued on Sep. 9, 2003 and entitled "METHODS FOR WAFER PROXIMITY CLEANING AND DRYING." This U.S. Patent, which is assigned to Lam Research Corporation, the assignee of the subject application, is incorporated herein by reference.

For additional information about top and bottom menisci, reference can be made to the exemplary meniscus, as disclosed in U.S. patent application Ser. No. 10/330,843, filed on Dec. 24, 2002 and entitled "MENISCUS, VACUUM, IPA VAPOR, DRYING MANIFOLD." This U.S. Patent, which is assigned to Lam Research Corporation, the assignee of the subject application, is incorporated herein by reference.

For additional information about menisci, reference can be made to U.S. Pat. No. 6,998,327, issued on Jan. 24, 2005 and entitled "METHODS AND SYSTEMS FOR PROCESSING A SUBSTRATE USING A DYNAMIC LIQUID MENIS- CUS," and U.S. Pat. No. 6,998,326, issued on Jan. 24, 2005 and entitled "PHOBIC BARRIER MENISCUS SEPARATION AND CONTAINMENT." These U.S. Patents, which are assigned to the assignee of the subject application, are incorporated herein by reference in their entirety for all purposes.

For additional information about the proximity vapor clean and dry system, reference can be made to an exemplary system described in the U.S. Pat. No. 6,488,040, issued on Dec. 3, 2002 and entitled "CAPILLARY PROXIMITY HEADS FOR SINGLE WAFER CLEANING AND DRYING." This U.S. Patent, which is assigned to Lam Research Corporation, the assignee of the subject application, is incorporated herein by reference.

Figure 6:
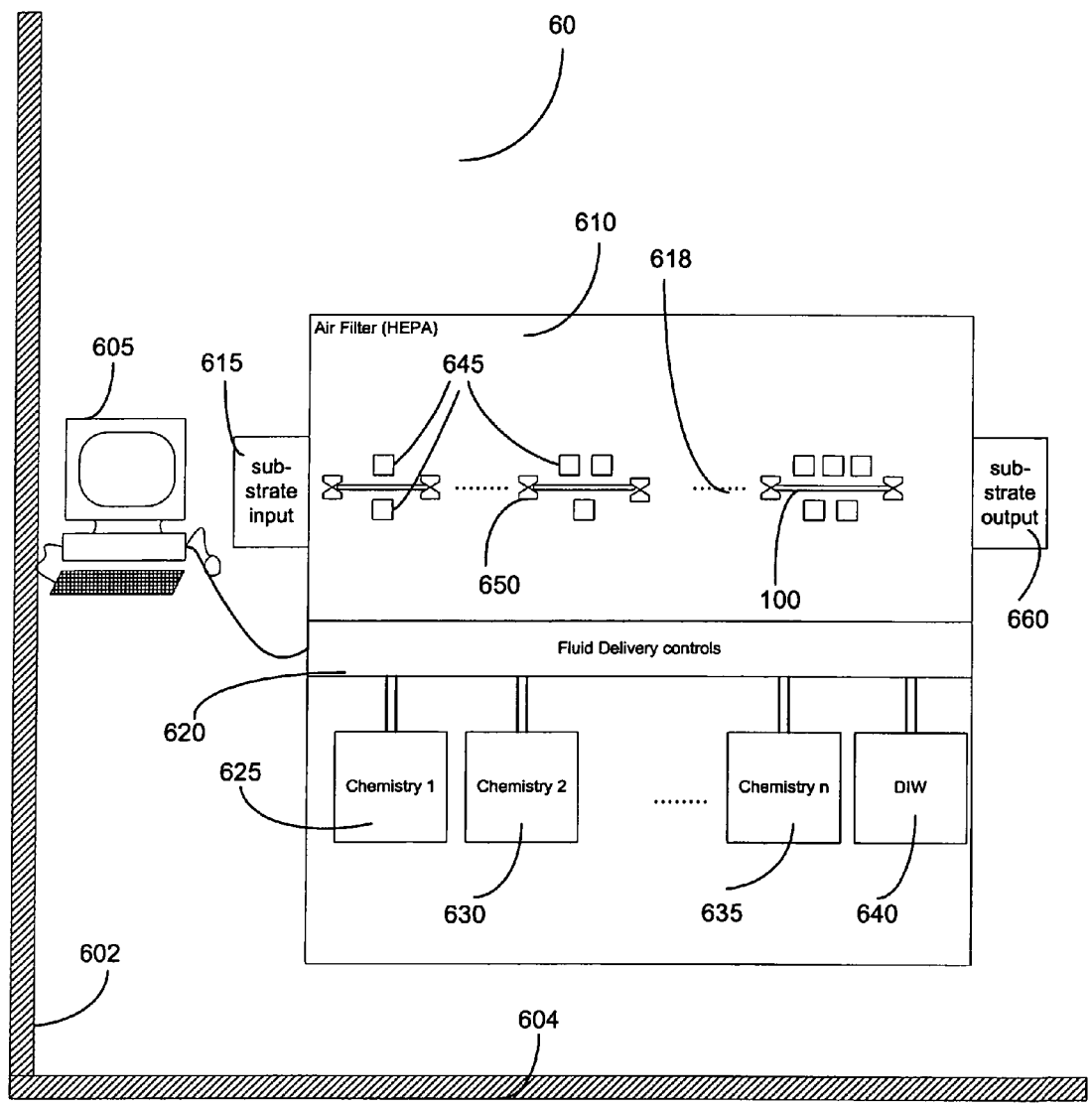
FIG. 6 is a cross-section view of a system employing proximity heads to apply control chemistry, in one embodiment of the invention.
Figure 7:
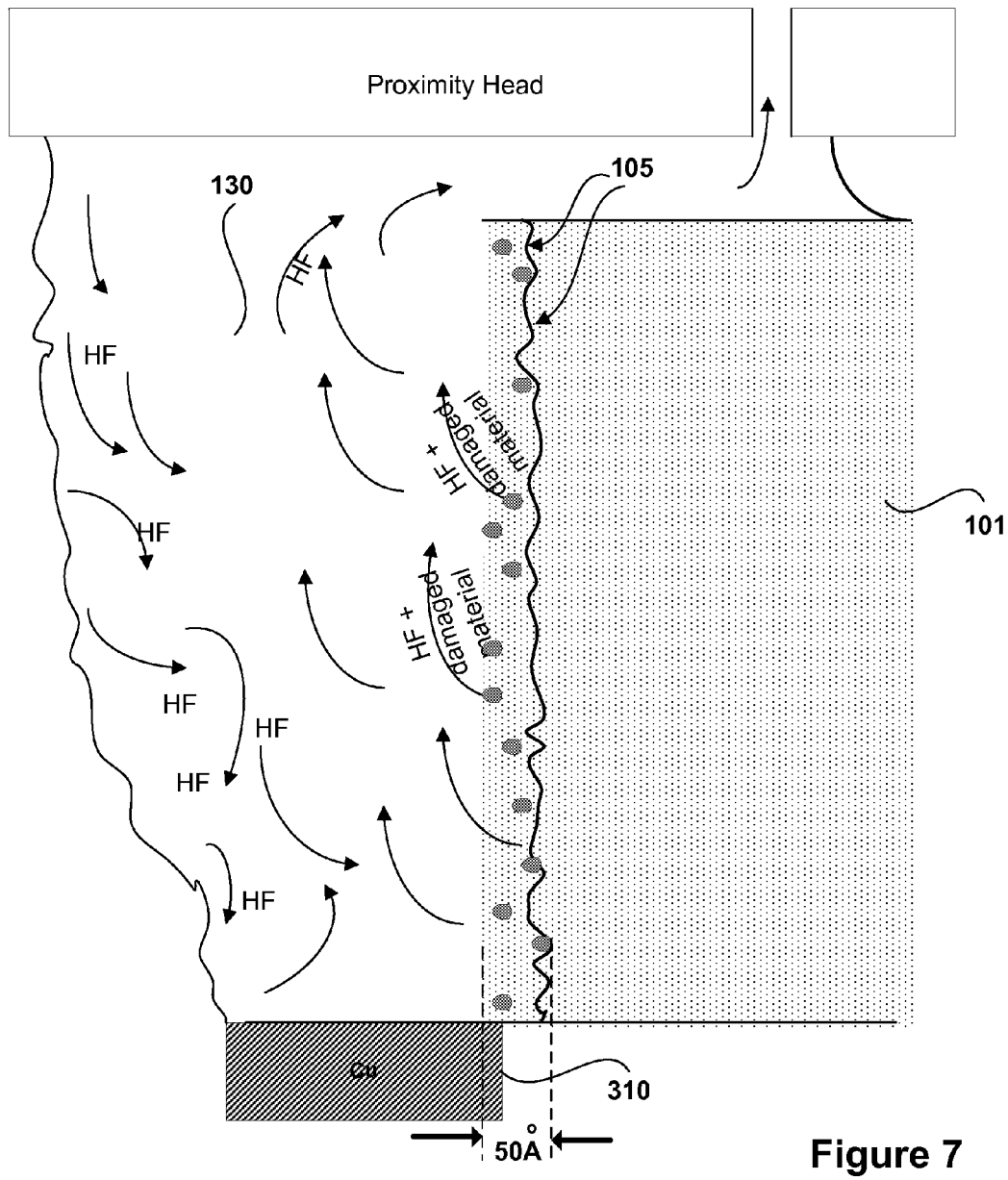
FIG. 7 is a cross-sectional view illustrating the actual removal of a damaged material when a control chemistry is applied to the low-k dielectric film layer, in accordance with an embodiment of the invention.

FIG. 6 illustrates a cross-section view of a system within a clean room 60 employing proximity heads used in applying control chemistry, a wall 602 and floor 604 of which are shown. The system in the clean room (system) 60 includes a housing chamber 610, within which a plurality of proximity heads 645 are located. The proximity heads shown within the housing chamber 610 include dual proximity heads 645 positioned on either side of a processing region 618 through which a substrate 100 moves in the housing chamber 610. Variations of the number and position of proximity heads can be employed. FIG. 6 shows some of the variations, such as dual proximity heads, 3 proximity heads and 5 proximity heads, located on either side of the processing region 618, through which the substrate 100 with damaged material 105 is transported. The substrate 100 is introduced into the housing chamber 610 through a substrate input region 615 and is removed from a substrate output region 660. A carrier 650 positioned in the processing region 618 aids in receiving the substrate through the substrate input region 615, transporting the substrate 100 across the system 60 through the proximity heads 645 and delivering the substrate at the substrate output region 660. The system 60 also includes a set of reservoirs 625, 630, 635, etc. to contain a plurality of chemistries including control chemistry that are used in removing the damaged material 105. Although the system is shown using a plurality of cleaning chemistries along with control chemistry and De-Ionized water (DIW), the system can be employed to apply a variation of control chemistries, cleaning chemistries and DIW using one or more proximity heads. In one embodiment, the system 60 is used to apply 1) DIW to lightly clean the substrate 100, 2) light Hydrofluoric acid to remove minor contaminants, and 3) control chemistry to remove the damaged material 105. In other embodiments of the invention, the system 60 may be used to apply 1 and 3 alone or just 3.

The control and cleaning chemistries are applied to the surface of the substrate 100 in a controlled manner, based on a plurality of process parameters of the damaged material 105 to be removed and the corresponding film layers formed over and under the damaged material 105, using a fluid delivery control mechanism 620. A computer 605 running a software may be communicatively connected to the fluid delivery control mechanism 620 to adjust the controls within the fluid delivery control mechanism 620 so that the control and cleaning chemistries may be applied to the substrate 100 in a controlled manner. Although the computer 605 is shown to be located within the clean room, the computer 605 can be positioned anywhere outside the clean room and communicatively connected to the fluid delivery control mechanism 620 within the housing chamber 610.

In another embodiment of the invention, a brush can be used instead of a proximity head. In this embodiment, the control chemistry is identified and the identified control chemistry is introduced into the brush. A plurality of process parameters are established based on an analysis of the damaged material 105 at the low-k dielectric film layer 101. The brush with the control chemistry is applied to the damaged material 105 at the low-k dielectric film layer 101 based on the established process parameters of the damaged material 105 so that substantial amount of the damaged material 105 is selectively removed. The process parameters of the damaged material 105 help in configuring the application of the control chemistry by controlling the concentration, temperature and exposure time of the control chemistry during the application. By exposing the damaged material 105 to the appropriately configured control chemistry, substantial portion of the damaged material 105 is removed thereby retaining the low-k characteristics of the low-k dielectric film layer 101.

A method for removing a damaged material 105 from a low-k dielectric film layer 101 of a substrate will now be described in detail with reference to FIG. 8. The method begins with identifying a control chemistry to be applied to a damaged material 105 in a region where a feature 130 was formed through the low-k dielectric film layer 101, as shown in operation 805. The low-k dielectric film layer 101 may get damaged by one or more fabrication operations, such as CMP, etching, photolithography, deposition, etc., that are used in creating features 130 through the low-k dielectric film layer 101. The chemicals used in these operations may react with the carbon doped in the low-k dielectric film layer at regions around the formed features 130, depleting the carbon from the low-k dielectric film layer 101. The carbon depleted low-k dielectric film layer 101 in areas around the features 130 will have a higher dielectric constant than the rest of the low-k dielectric film layer 101, resulting in line delay. The damaged material 105, therefore, needs to be removed to substantially retain the low-k dielectric characteristics of the dielectric film layer.

The control chemistry is chosen such that the damaged material 105 may be selectively removed without damaging the surrounding features. Control chemistry that is used in selective removal of the damaged material 105 include diluted Hydrofluoric acid, Phosphoric acid or Sulfuric acid diluted to about 1 part of acid to 100 parts of de-ionized water, or other fluoride containing salts such as ammonium fluoride, etc.

In operation 810, a plurality of process parameters characterizing the aspects of damaged material 105 to be removed, is established. The process parameters define the aspects of the damaged material 105 so that the control chemistry may be applied accordingly, for effective removal of substantial portion of the damaged material 105. The process parameters may additionally characterize the aspects of other film layers 118, 120, 322 that are formed above and below the damaged material 105 so that these film layers may also be selectively removed. Removing portions of additional film layers 118, 120, 322 may depend on an integration scheme followed in the fabrication of various features on the substrate. Some of the film layers that may be selectively removed during the removal of the damaged material 105 might include etch stop layer 120, hard mask layer 322, etc.

The process parameters that might affect the application of the control chemistry define the characteristic of the damaged material 105. The process parameters may additionally include the characterization aspects of one or more layers 118, 120, 322 formed above and below the low-k dielectric film layer 101 through which the feature 130 is formed. These layers may be formed by a plurality of fabrication operations. The process parameters of the different film layers help in configuring the application of the control chemistry by controlling the concentration, temperature and exposure time of the control chemistry during the application so that substantial amount of the damaged material 105 and corresponding film layers 118, 120, 322 formed above and below the damaged material through which the feature 130 is formed, are removed. The process parameters include one or more of type of film layer, chemical composition of the film layer, thickness of the damaged material and temperature at the region of the damaged material.

In operation 815, the control chemistry is applied to the low-k dielectric film layer 101 near the damage material 105. The application of the control chemistry defined by such characteristics as flow rate of the control chemistry, temperature of the control chemistry, concentration of the control chemistry and exposure time of the control chemistry are controlled based on the process parameters of the film layers to be removed. By providing a way of exposing the damaged material 105 and the adjoining film layers to the defined control chemistry, substantial amount of the damage material 105 can be removed without causing irreparable damage to the adjoining features and layers.

The characteristics of the control chemistry defined, and controlled by the process parameters, are flow rate of the control chemistry, concentration of the control chemistry, temperature of the control chemistry, and exposure time of the control chemistry. The flow rate of the control chemistry that has shown promising results in removing damaged material 105 is between about 0.2 standard liters per minute (slm) to about 2.0 slm with a mid range between about 0.8 slm to about 1.5 slm and an optimal flow rate of about 1.2 slm. Concentration of control chemistry that has shown promising results in removing damaged materials 105 is between about 1:1000 parts to about 1:10 parts of control chemistry to deionized water with a mid range between about 1:100 to about 1:300 parts of control chemistry to deionized water. Temperature of control chemistry ranges between about 20° C. to 80° C. with a mid-range of about 22° C. to about 40° C. and an optimal temperature of about 25° C. Exposure time that has shown promising results in removing damaged materials is between about 0.5 second to about 10 seconds with a mid-range of about 1 second to about 5 seconds.

In operation 820, the damaged material is substantially removed from an area of low-k dielectric film layer around the feature so as to substantially maintain the low-k characteristics of the low-k dielectric film layer. The process continues with operation 825, wherein additional layers may be formed over the low-k dielectric film layer to define an integrated circuit chip (IC chip). Some of the additional layers that may be formed include barrier layer, copper film deposit layer to define the metallization interconnects and low-k dielectric film layer, etc. The process may repeat till IC chips are formed on the substrate or some level of fabrication is reached.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for removing a damaged material from a low-k dielectric film layer of a substrate, comprising:

providing a control chemistry, the control chemistry configured to selectively remove the damaged material from the low-k dielectric film layer, the damaged material being in regions where features were formed through the low-k dielectric film layer, wherein the control chemistry includes an acid diluted to about 1 part of acid to about 100 parts of de-ionized water;

applying the control chemistry to the low-k dielectric film layer using a proximity head, the proximity head includes a head surface that is placed proximate to a low-k dielectric film layer of the substrate, the proximity head further having a plurality of inputs for applying the control chemistry as a fluid meniscus between the low-k dielectric film layer of the substrate and the head surface of the proximity head, and a plurality of outputs for removing the control chemistry; and moving the fluid meniscus over the substrate so as to uniformly expose the regions of the damaged material of the low-k dielectric film layer for a brief period of time, the fluid meniscus covering less than an entire area of the substrate such that the damaged material is substantially removed from the exposed regions to define low-k characteristics in place of the damaged material, wherein the fluid meniscus being moved defines the brief period of time for exposing the control chemistry ranging between about 0.5 seconds to about 10 seconds and wherein the control chemistry is applied with a flow rate of between about 0.2 standard liters per minute to about 2.0 standard liters per minute and is directed from the head surface of the proximity head toward the surface of the substrate.

2. The method for removing a damaged material from a low-k dielectric film layer of a substrate of claim 1, wherein the damaged layer has a higher dielectric constant than the adjoining low-k dielectric film layer.

3. The method for removing a damaged material from a low-k dielectric film layer of a substrate of claim 2, wherein the higher dielectric constant has a carbon depleted characteristic.

4. The method for removing a damaged material from a low-k dielectric film layer of a substrate of claim 3, wherein carbon depletion is caused by any one of a plurality of fabrication operations performed to define features of the substrate, the plurality of fabrication operations being one or more of etching, deposition, chemical mechanical polishing, and photolithography.

5. The method for removing a damaged material from a low-k dielectric film layer of a substrate of claim 1, wherein a plurality of film layers are formed above and below the low-k dielectric film layer, the plurality of film layers formed by a plurality of fabrication operations that define the features of the substrate.

6. The method for removing a damaged material from a low-k dielectric film layer of a substrate of claim 5, wherein the feature is formed through the plurality of film layers.

7. The method for removing a damaged material from a low-k dielectric film layer of a substrate of claim 6, further including substantially removing portions of the film layer from an area around the feature such that the feature profile is maintained.

8. The method for removing a damaged material from a low-k dielectric film layer of a substrate of claim 1, wherein the plurality of process parameters include one or more of a type of film layer to be removed, chemical composition of a film layer to be removed, thickness of a film layer to be removed, temperature at a film layer to be removed prior to application of the control chemistry.

9. The method for removing a damaged material from a low-k dielectric film layer of a substrate of claim 1, wherein the application of the control chemistry is through a control mechanism, the control mechanism configured to control one or more characteristics of the control chemistry during the application of the control chemistry based on the plurality of established process parameters of the damaged material.

10. The method for removing a damaged material from a low-k dielectric film layer of a substrate of claim 9, wherein the characteristics of the control chemistry include one or more of flow rate of the control chemistry, concentration of the control chemistry, temperature of the control chemistry, and exposure time of the control chemistry.

11. The method for removing a damaged material from a low-k dielectric film layer of a substrate of claim 1, wherein the application of the control chemistry is during a cleaning operation performed on the substrate, the control chemistry being included with a cleaning chemistry and applied to the low-k dielectric film layer during the cleaning operation performed on the substrate.

12. The method for removing a damaged material from a low-k dielectric film layer of a substrate of claim 1, wherein the application of the control chemistry is during a cleaning operation performed on the substrate, the control chemistry being alternately applied with a cleaning chemistry to the surface of the substrate during the cleaning operation performed on the substrate.

13. The method for removing a damaged material from a low-k dielectric film layer of a substrate of claim 1, wherein the acid is selected from a group consisting of Hydrofluoric acid, Sulphuric acid and Phosphoric acid.

14. A method for processing a substrate having a damaged material in a low-k dielectric film layer of the substrate, the method comprising:

applying a chemistry to selectively remove the damaged material from the low-k dielectric film layer using a proximity head, the proximity head includes a head surface that is placed proximate to a low-k dielectric film layer of the substrate, the proximity head further having a plurality of inputs for applying the chemistry as a fluid meniscus between the low-k dielectric film layer of the substrate and the head surface of the proximity head and a plurality of outputs for removing the chemistry, the damaged material being in regions where features were formed, wherein the chemistry includes a fluoride containing salt; and moving the fluid meniscus over the substrate so as to uniformly expose the regions of the damaged material of the low-k dielectric film layer for a brief period of time, the fluid meniscus covering less than an entire area of the substrate such that the damaged material is substantially removed from the exposed regions to define low-k characteristics in place of the damaged material, wherein the fluid meniscus being moved defines the brief period of time for exposing the chemistry ranging between about 0.5 seconds to about 10 seconds and wherein the control chemistry is applied with a flow rate of between about 0.2 standard liters per minute to about 2.0 standard liters per minute and is directed from the head surface of the proximity head toward the surface of the substrate.

15. The method of claim 14, wherein the fluoride containing salt is any one of an Ammonium Fluoride or other fluoride containing salt.

16. The method of claim 14, wherein the application of the control chemistry is during a cleaning operation performed on the substrate, the control chemistry being included with a cleaning chemistry and applied to the low-k dielectric film layer during the cleaning operation performed on the substrate.

17. The method of claim 14, wherein the application of the control chemistry is during a cleaning operation performed on the substrate, the control chemistry being alternately applied with a cleaning chemistry to the surface of the substrate during the cleaning operation performed on the substrate.

* * * * *